(12) United States Patent
Tzivanopoulos et al.

(10) Patent No.: US 10,079,408 B2
(45) Date of Patent: Sep. 18, 2018

(54) METHOD AND DEVICE FOR MEASURING THE ELECTRIC CURRENT OF A BATTERY WITH MULTIPLE BATTERY MODULES

(71) Applicant: Robert Bosch GmbH, Stuttgart (DE)

(72) Inventors: Chrysanthos Tzivanopoulos, Remseck am Neckar (DE); Joerg Schneider, Stuttgart (DE); Lisa Lorenz, Stuttgart (DE); Sven Bergmann, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 15 days.

(21) Appl. No.: 15/326,119

(22) PCT Filed: Jun. 10, 2015

(86) PCT No.: PCT/EP2015/062883
§ 371 (c)(1),
(2) Date: Jan. 13, 2017

(87) PCT Pub. No.: WO2016/008649
PCT Pub. Date: Jan. 21, 2016

(65) Prior Publication Data
US 2017/0207496 A1    Jul. 20, 2017

(30) Foreign Application Priority Data

Jul. 15, 2014 (DE) ........................ 10 2014 213 731

(51) Int. Cl.
*H01M 10/48* (2006.01)
*H01M 10/42* (2006.01)
*G01R 31/36* (2006.01)

(52) U.S. Cl.
CPC .... *H01M 10/4285* (2013.01); *G01R 31/3606* (2013.01); *G01R 31/3651* (2013.01);
(Continued)

(58) Field of Classification Search
CPC ............ H01M 10/2185; H01M 10/482; G01R 31/3606; G01R 31/3651
See application file for complete search history.

(56) References Cited

U.S. PATENT DOCUMENTS 3,252,070 A * 5/1966 Medlar ................... H02J 7/022
                                                      320/141
9,733,310 B2 * 8/2017 Thoelmann ........... B60L 3/0046
(Continued)

FOREIGN PATENT DOCUMENTS

| CA | 2594703 | 1/2009 |
|---|---|---|
| DE | 102009054937 | 6/2011 |
| WO | 2014010411 | 1/2014 |

OTHER PUBLICATIONS

International Search Report for Application No. PCT/EP2015/062883 dated Oct. 13, 2015 (English Translation, 3 pages).
(Continued)

*Primary Examiner* — Abdullah Riyami
*Assistant Examiner* — Nader Alhawamdeh
(74) *Attorney, Agent, or Firm* — Michael Best & Friedrich LLP

(57) ABSTRACT

The invention relates to a method for measuring an electric current of a battery (10) with multiple battery modules (11), having the step of measuring a temperature related to the battery module (11). According to the method, the temperature of a connector is first determined for at least one battery module (11) using the measured temperature and a temperature model, and the electric resistance of the connector is determined using a resistance model and the temperature of the connector. The electric voltage which drops at the connector is then measured, and the electric current flowing through the connector is calculated from the voltage. The
(Continued)

invention additionally relates to a corresponding device and to a battery comprising such a device.

20 Claims, 5 Drawing Sheets

(52) U.S. Cl.
CPC ...... *G01R 31/3658* (2013.01); *H01M 10/482* (2013.01); *H01M 10/486* (2013.01); *H05K 999/99* (2013.01)

(56) References Cited

U.S. PATENT DOCUMENTS

| | | | |
|---|---|---|---|
| 2006/0091891 A1 | 5/2006 | Woo et al. | |
| 2008/0071483 A1* | 3/2008 | Eaves | G01R 31/3624 702/63 |
| 2010/0271036 A1* | 10/2010 | Kishimoto | B60L 11/1855 324/434 |
| 2011/0199091 A1 | 8/2011 | Tanabe | |
| 2012/0105068 A1* | 5/2012 | Wang | H01M 10/0525 324/427 |
| 2012/0274285 A1* | 11/2012 | Chawla | H01M 10/44 320/127 |
| 2013/0342213 A1* | 12/2013 | Seol | G01R 31/3624 324/434 |
| 2014/0287278 A1* | 9/2014 | Despesse | H01M 2/1072 429/7 |
| 2015/0340745 A1* | 11/2015 | Inoue | H01M 10/6563 429/120 |
| 2016/0276720 A1* | 9/2016 | Steil | H01M 2/10 |
| 2017/0207496 A1* | 7/2017 | Tzivanopoulos | H01M 10/4285 |

OTHER PUBLICATIONS

Song et al., "Verification of battery system model for environmentally friendly vehicles using a battery hardware-in-the-loop simulation," IET Power Electronics, vol. 6, No. 2, Feb. 1, 2013, pp. 417-424.

* cited by examiner

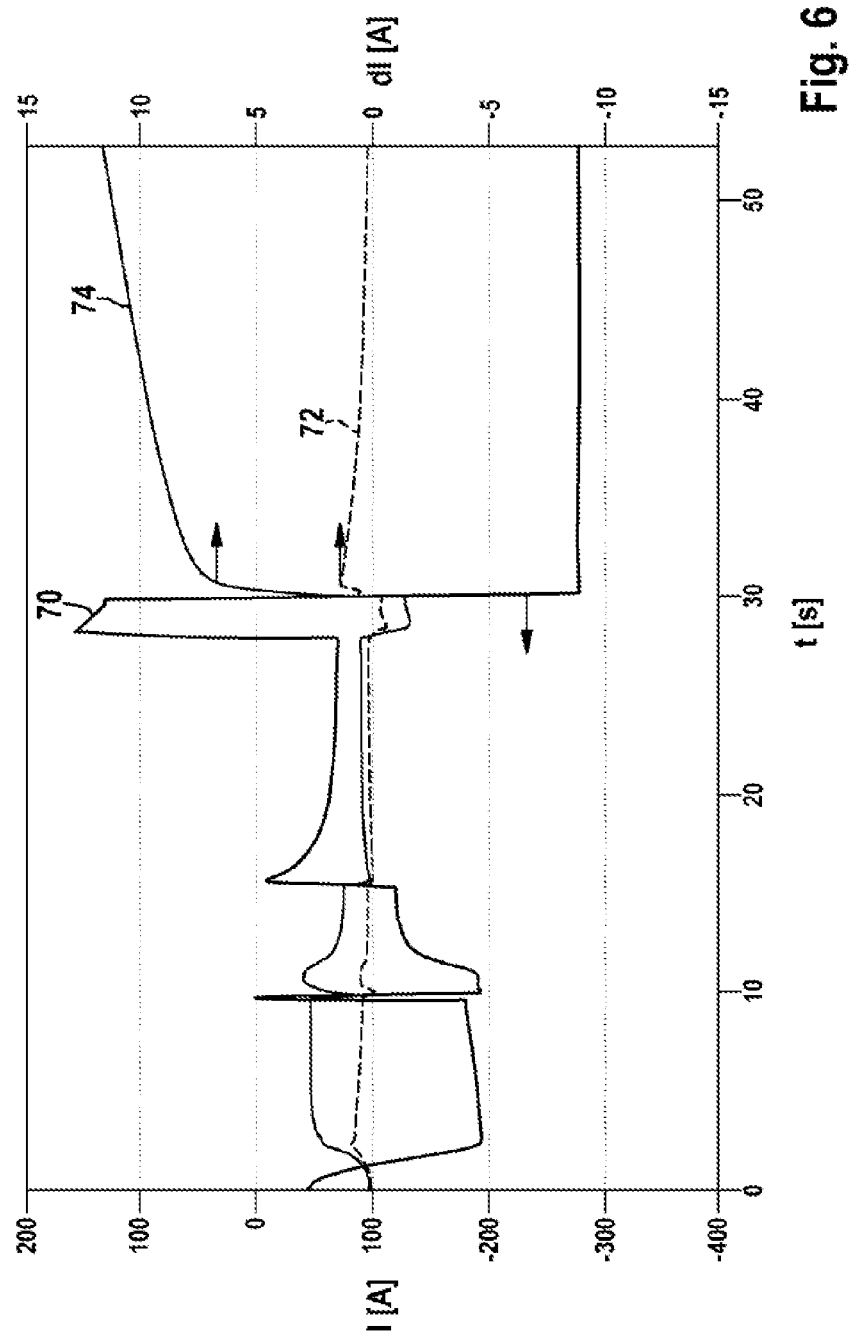

METHOD AND DEVICE FOR MEASURING THE ELECTRIC CURRENT OF A BATTERY WITH MULTIPLE BATTERY MODULES

BACKGROUND OF THE INVENTION

The invention relates to a device and a method for measuring an electrical current of a battery having multiple battery modules. Furthermore, the invention relates to a battery comprising such a device for measuring an electrical current.

In the case of hybrid vehicles or solely electrically driven vehicles, it is necessary to store large quantities of electrical energy. In order to store the electrical energy, battery systems are used that comprise in each case a multiplicity of battery cells and an associated battery management system. The battery management system comprises monitoring units with which the state of the battery or of the battery module and of the battery cells can be monitored, and also a battery control unit.

The monitoring units of the battery comprise monitoring sensors and direct the signals of the sensors to the battery control unit. The monitoring sensors ascertain important state parameters of the battery cells that include in particular the temperature, the voltage, the cell internal resistance and the through-flowing electrical current. In order to be able to compile with current safety regulations, the relevant monitoring sensors are generally embodied in a redundant manner.

US 2010/0271936 A1 discloses a battery module that comprises a multiplicity of battery cells. The individual battery cells of the battery module are connected to one another in the form of a series connection by way of the cell connector. The battery module comprises furthermore a cell monitoring unit in order to monitor the temperature of the battery module, the through-flowing current and also the voltages of the individual battery cells. Multiple thermistors are provided in the region of the battery cells for the purpose of monitoring the temperature. In order to measure the voltage of the battery cells, each cell connector is connected to the monitoring unit. The voltage of a battery can then be measured as the voltage between the two cell connectors that are connected to this battery cell. For the purpose of measuring the electrical voltage, a cell connector is connected to the monitoring unit by way of two lines. The first line is arranged in the region of the connection to a first battery cell and the second line is arranged in the region of the connection to a second battery cell. An electrical current that is flowing by way of the cell connection causes a voltage drop at this cell connector. This voltage drop at the cell connector can be measured using the monitoring unit by way of the two connecting lines. It is possible to conclude the magnitude of through-flowing current from this measured voltage drop together with a predetermined electrical resistance of the cell connector.

US 2011/0199091 A1 describes a current sensor for a battery. The current sensor comprises a measuring resistor, a circuitry and a housing. The current sensor is arranged on the battery in such a manner that it is integrated in the electrical current circuit between the consumer and the battery. For this purpose, it is arranged on one of the battery poles. A voltage drop occurs at the measuring resistor and is measured. An integrated circuitry evaluates the voltage difference and can broadcast the result by way of a databus by way of example a CAN bus.

A disadvantage of the prior art is that in order to comply with predetermined safety requirements, such as by way of example a specific ASIL Level (Automotive Safety Integrity Level), it is necessary to use multiple sensors to measure the battery current. The hitherto required redundancy increases the effort involved in integrating the current sensors and also the costs.

SUMMARY OF THE INVENTION

A method is proposed for measuring an electrical current of a battery having at least two battery modules having in each case at least two battery cells, said method comprising for at least one battery module the step of measuring a temperature that is allocated to the battery module and for at least one connector the steps of:

(a) determining the temperature of the connector with the aid of the measured temperature and a temperature model, (b) calculating the electrical resistor of the connector with the aid of a resistance model and the temperature of the connector that is determined in accordance with step a), (c) measuring the electrical voltage that drops at the connector, and (d) calculating the electrical current that is flowing through the connector, said calculation being based on the calculated electrical resistance in accordance with step b) and the voltage measured in step c), wherein the connector is a cell connector that connects two battery cells of the battery module to one another in an electrical manner, or said connector is a module connector that contacts the battery module in an electrical manner.

A battery, in particular a battery for a hybrid vehicle or a solely electrically driven vehicle, comprises in general a multiplicity of battery cells. These battery cells are usually initially combined to form a battery module, wherein the battery comprises multiple such modules. Within the scope of the description, the term 'battery' is usually used as it is in common language use so that the term 'battery' includes both a primary battery and also a secondary battery (rechargeable battery). Accordingly, the term 'battery cell' includes both primary and also secondary cells and the term 'battery module' includes both battery modules that are constructed from primary cells and also battery modules that are constructed from secondary cells.

In order to achieve the required performance data, the individual battery cells and the battery modules are connected to one another in an electrical manner by way of connectors. There are cell connectors that connect two battery cells of a battery module to one another in an electrical manner, and module connectors that connect two battery modules to one another in an electrical manner, or connect one module to a connector or terminal of the battery.

It is preferred that lithium ion-based battery cells are used owing to their high energy density. In the case of the method in accordance with the invention, the individual battery cells in one battery module are connected to one another in the form of a series connection, wherein in each case a cell connector connects two battery cells with one another. One cell connector connects in each case a negative terminal to a positive terminal of an adjacent battery cell. The battery modules are in turn connected to one another in an electrical manner with the aid of module connectors, wherein it is possible for this purpose to likewise use a series connection.

Since the through-flowing current is constant throughout a series connection, it is sufficient for measuring the electrical current of the battery if the electrical current that is flowing through one connector is determined. It is preferred that the steps a) to d) of the method are performed for each battery module of the battery. If the electrical current that is flowing through a connector is determined for more than one connector, this creates a measurement redundancy. It is possible to determine the electrical current that is flowing through a connector, in that the electrical current that is dropping across the connector is determined and this is divided over the electrical resistance of the connector. For the purpose of measuring the voltage, the connector is contacted in an electrical manner at two sites.

If the voltage is measured at one connect connector, it is preferred that a first electrical connection is arranged in the region of the connection of the cell connector to a first terminal and a second electrical connection is arranged in the region of the connection of the cell connector to a second battery terminal.

If the voltage is to be measured at a module connector, it is preferred that a first electrical connection is arranged in the region of the connection of the module connector to a terminal of a battery cell and a second electrical connection is arranged in the region of the connection of the module connector to a current rail or a connector on the battery.

The electrical resistance of the connector is however dependent upon the temperature. In addition, the electrical current that is flowing through the connector causes the connector to heat up so that the measurements are falsified in the absence of a temperature compensation.

For this reason, a temperature that is allocated to the battery module is initially measured as a starting point. It is preferred that the temperature is measured at a site on the battery that is in the proximity of a connector. It is preferred in one further variant that the temperature is measured at a terminal of a battery cell that is connected to the connector. However, it is also possible in a different variant of the invention to measure the temperature at a housing of a battery cell or at a housing of the battery module. Furthermore, it is feasible to measure the temperature at each battery cell or in the region of each connector.

Subsequently, the measured starting temperature and a temperature module of the connector are used to calculate the temperate of said connector. The temperature model can be achieved in the form of a thermal network. The various aspects contributing to the temperature of the connector are taken into consideration. The temperature of the connector is influenced on the one hand by the increase in temperature of the connector as a result of the Joule's heating effect, in other words as a result of the through-flowing electrical current. Furthermore, the temperature is influenced as a result of coming into contact with the environmental air and the thermal conduction to the terminals of the battery cell. A simple model can be expressed by way of example by the equation:

$$T_{bond}=(T_{amb} \cdot Rth_{ctb}+T_{ct} \cdot Rth_{amb}+P_{bond} \cdot Rth_{ctb} \cdot Rth_{amb}):(Rth_{amb}+Rth_{ctb}).$$

$T_{bond}$ represents the temperature of the connector, $T_{amb}$, represents the ambient temperature, $T_{ct}$ represents the temperature at a terminal of a battery cell, $Rth_{ctb}$ represents the thermal resistance between the cell terminal and the connector, $Rth_{amb}$ represents the thermal resistance between the connector and the environment and $P_{bond}$ represents the power lost at the connector as a result of the Joule's heating effect.

The Joule's heating effect that occurs as a result of the current flowing through the connector is described by:

$$P_{bond}=I^2 \cdot R_{bond},$$

wherein I describes the current that is flowing through the connector.

In the second step b) of the method, the electrical resistance of the connector is measured with the aid of the previously determined temperature and a resistance model. In a simple case, the resistance module is a linear function of the temperature:

$$R_{bond}(T_{bond})=R_{bond}(T0)+R_{bond}(T0) \cdot A \cdot (T_{bond}-T0).$$

$R_{bond}$ represents the electrical resistance of the connector, $R_{bond}(T0)$ represents the electrical resistance of the cell connector at the temperature T0 and A is a contact that indicates the temperature dependence of the resistance of the connector.

In the third step c) of the method, the electrical voltage that is dropping at the connector is measured and in the fourth and final step d) of the method the current is calculated with the aid of the measured voltage and the previously determined electrical resistance of the connector. The current I that is flowing through the connector can be obtained by means of:

$$I=U:R_{bond}(T_{bond})$$

wherein U represents the voltage that is dropping at the connector.

In a preferred embodiment of the method, a mean value for the electrical current of the battery is formed from the electrical currents that are calculated for the connectors of the battery. As a consequence measurement errors are reduced and a more stable measurement result is achieved.

In a preferred embodiment, the temperatures that are determined for the individual battery module and the voltage drops that are determined for the individual connectors are compared with the determined mean values. If a measured value deviates from the mean value to such an extent that a predetermined threshold value is exceeded, then it is concluded from this that a measuring means that is being used for taking the measurement has failed. This plausibility check that is performed by means of this comparison prevents any greatly deviating measurement results from remaining undiscovered.

In one embodiment of the method, in the event of the measuring means failing, only the connector for which a current can be determined is taken into consideration when calculating the mean value. The term 'measuring means' refers to the means that are required to determine the temperature, determine the voltage drop across the connector and to perform the required calculations. By virtue of the fact that only the successfully performed measurements and used when determined the mean value, a high degree of reliability of the current measurement can also be achieved if parts of the measuring means fail. Since a battery usually comprises a multiplicity of battery modules and consequently current is also measured at a multiplicity of connectors, there is a high rate of redundancy.

In one embodiment of the method, the resistance models of the connectors are calibrated in that the battery is charged with a definite charging current and the electrical resistance of the connector is determined simultaneously. In this case, the current that is flowing through the connector is known, since the current within a current circuit is constant. Consequently, it is then possible to determine the actual resistance of the connector by way of the equation:

$$R_{bond}(T_{bond})=U:I.$$

The temperature $T_{bond}$ of the connector can be determined as previously described using the temperature model.

In a preferred embodiment of the invention, a plausibility check can also be performed at the same time as the calibration process. For this purpose, a mean value is formed from the values for the electrical resistance that are measured by means of the calibration process and the individual measurements are compared with this mean value. If a measurement result deviates from the mean value to such an extent that a threshold value is exceeded, then it is concluded that an error has occurred during the calibration process or that the measuring means being used have failed.

A further aspect of the invention relates to a device for measuring the electrical current of a battery having multiple battery modules.

It is preferred that the device is embodied and/or adapted so as to perform the method described herein. Accordingly, features that are described within the scope of the method apply accordingly for the system and conversely the features that are described within the scope of the system apply accordingly for the method.

The proposed device comprises for at least one battery module means for measuring the temperature in order to determine a temperature that is allocated to the battery module, means for measuring the voltage in order to determine a voltage drop at a connector, and also means for calculating a temperature of the connector by taking into consideration a measured temperature and a temperature model, means for calculating the electrical resistance of the connector by taking into consideration the calculated temperature of the connector and a resistance model, and also means for calculating the electrical current that is flowing through the connector, wherein the connector is a cell connector that connects two battery cells of the battery module to one another in an electrical manner, or said connector is a module connector that contacts the battery module in an electrical manner. In a preferred variant, all battery modules of the battery are embodied in an identical manner so that the current can be measured at each battery module.

The device is allocated to the battery or to a battery module comprising multiple battery cells. The device monitors the electrical current of the battery and transmits the measured values preferably to other control devices.

The means for measuring a temperature that is allocated to the battery module are embodied as temperature sensors, by way of example in the form of a thermistor, in other words an electrical resistor that is known to be temperature dependent. The means for measuring a voltage drop at a connector comprise two electrical connections to the connector in order to tap the electrical voltage, and means for determining the voltage. It is possible to use by way of example an amplifier with a downstream analogue/digital converter so as to determine the voltage.

The means for calculating a temperature of a connector, the means for calculating the electrical resistance and also the means for calculating the current can be implemented by way of example in the form of an integrated switching circuit or in the form of a computer program that is embodied on a computer device by way of example a microcontroller.

In one embodiment, the connectors can be embodied as a sheet metal.

In a further embodiment of the invention, the connectors are embodied as bonded connections. In the case of a bonded connection between two battery cells, the bonding wire is initially welded to the terminal of the first battery cell. Subsequently, the wire is guided to a corresponding terminal of the second battery cell and is likewise welded at this site to the terminal. If the connector is embodied as a module connector, then a bonded connection is produced accordingly between a terminal of a battery cell and a current rail or a connector on the battery. In order to achieve the required current carrying capacity or a lowest possible resistance, it is preferred that multiple such bonded connections are provided in order to receive a connector. By way of example, between 1 and 20, preferably between 5 and 15, bonded connections are used. It is particularly preferred to use 8 bonded connections. The precise number of bonded connections depends upon the required current carrying capacity, the material being used and the cross section of the bonding wire. Typical diameters for round bonding wire are between 10 and 100 um. In the case of bonding wires that have a rectangular cross-section, in this case also referred to as bonding tape, typical widths are in the range of 30 to 500 μm and the thicknesses in the range of 10 to 200 μm.

In one embodiment of the device, the material for the connectors is selected from an aluminum alloy, copper, Manganin, Constantan. The aluminum alloys are characterized by their comparatively low resistance and favorable price, whereas although by way of example Manganin and Constantan have a greater resistance, they are however less temperature dependent. If the connector is embodied in the form of bonded connections, it is in addition feasible to combine different types of bonding wires to form a connector. It is thus possible by way of example to use in a connector both bonding wires embodied from copper and bonding wires embodied from aluminum.

In one embodiment of the device, said device comprises a circuit board on which the means for measuring a voltage drop are arranged. In further embodiments, it is also possible to arrange on the circuit board means for calculating a temperature of a connector, means for calculating the electrical resistance and/or the means for calculating the electrical current.

In a preferred embodiment, the circuit board is connected by way of bonded contacts to at least one terminal of a battery cell and where appropriate to a module connector so that it is possible to measure the voltage drop at a connector.

For this purpose, it is preferred that the circuit board is embodied in such a manner that said circuit board extends over the entire length of the battery or of the battery module adjacent to the cell connectors. As a consequence, the effort for producing the contact arrangements between the circuit board and the connectors, in particular the cell connectors is reduced.

In one embodiment of the device, the means for measuring the temperature comprise a temperature sensor that is arranged on a terminal of a battery cell.

In the case of this arrangement, the measured temperature corresponds essentially to the temperature of the battery cell, however, it is possible, as a result of the good heat conduction between the terminal and the connector that is connected to said terminal, to easily conclude the temperature of the connector with the aid of the temperature module.

In further variants of the invention, it would also be feasible to arrange the means for measuring the temperature directly on the connectors. In further variants of the invention, it is also possible to arrange the means for measuring the temperature on a housing of a battery cell or of a battery module.

A further aspect of the invention relates to a battery that comprises such a device for measuring an electrical current of the battery.

The electrical current of a battery is measured on numerous occasions with the aid of the proposed method and the proposed device and in fact at least one connector of a module. Since the current is constant within a current circuit, a multiple redundancy is achieved in this manner when measuring the current. This is important since different variables, such as for example the state of charge of the battery, are calculated based on the electrical current in the battery. As a result of the redundancy that is built into the method or into the device, it is possible to forego a second current sensor without impairing the safety.

The method also advantageously achieves a high degree of measuring accuracy. The measuring accuracy is achieved on the one hand by virtue of the fact that a mean value can be formed from the multiplicity of measurements. On the other hand, it is proposed in accordance with the invention with the aid of models to determine precisely the electrical resistance of the connector, by way of which the current is determined, in dependence upon the temperature. It is feasible depending upon the embodiment to use for the connectors materials, whose electrical resistance demonstrates only a low temperature dependency. As a result of the temperature compensation, this is however not absolutely necessary so that it is also possible to use materials, such as for example aluminum alloys that comprise a lower electrical resistance. Depending upon the individual application, the method or the device can consequently be optimized accordingly.

BRIEF DESCRIPTION OF THE DRAWINGS

In the drawings:

FIG. 6 illustrates the current of a battery cell and also of the measurement error with temperature compensation and without temperature compensation.

DETAILED DESCRIPTION

Figure 1:
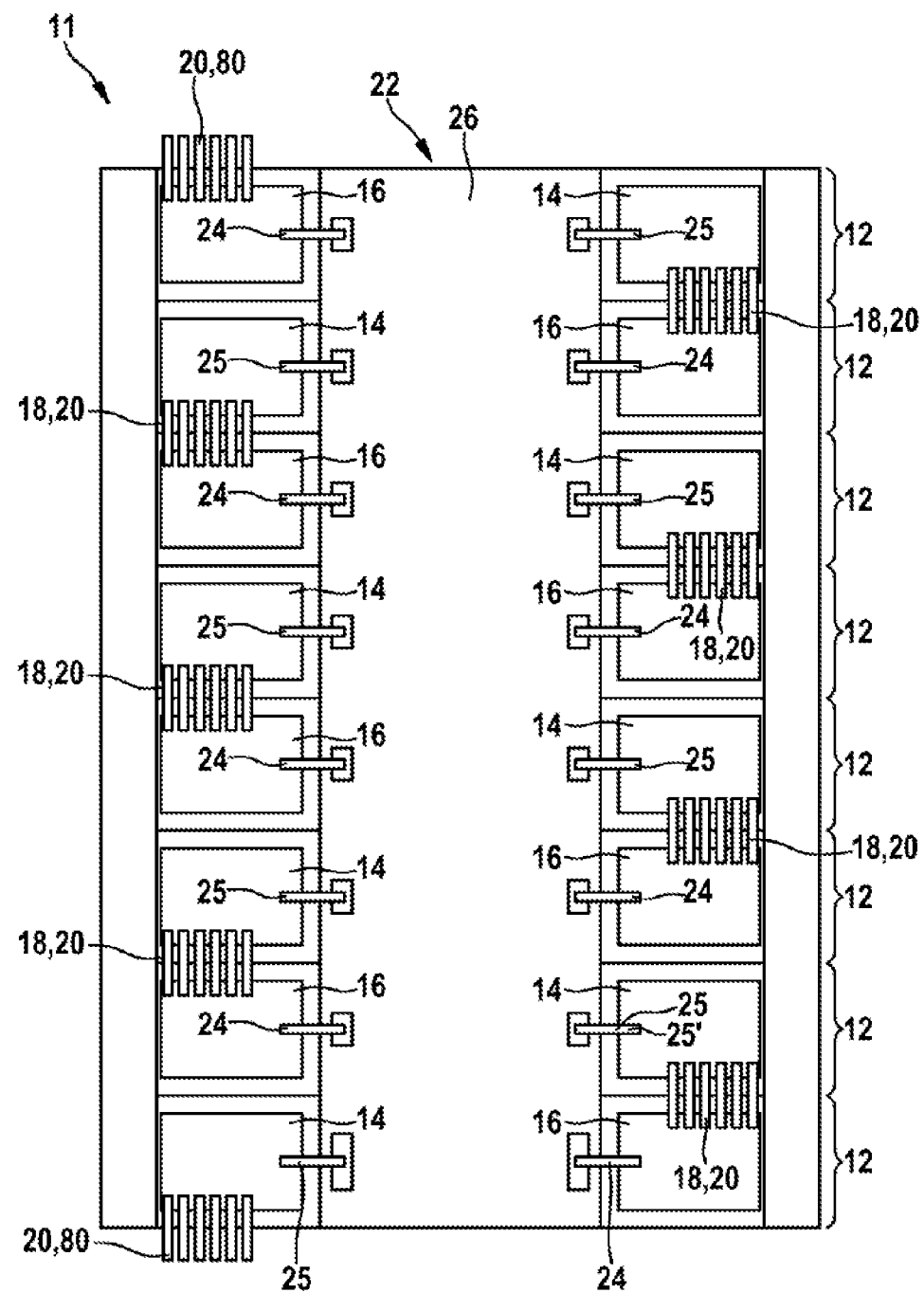
FIG. 1 illustrates a battery module having a device for measuring the electrical current.

Like or similar components and elements are described by like reference numerals in the description hereinunder of the exemplary embodiments of the invention, wherein a repeated description of these components or elements is not provided in the individual cases. The figures represent the subject matter of the invention only in a schematic manner.

FIG. 1 illustrates a battery module 11 having a device in accordance with the invention for measuring the electrical current of a battery.

A battery module 11 is illustrated in FIG. 1. The battery module 11 comprises a multiplicity of battery cells 12 that are arranged in an adjacent manner in the battery module 11. Each of the battery cells 12 comprises in each case a negative terminal 14 and a positive terminal 16, by way of which the battery cell 12 is contacted in an electrical manner. In each case, two adjacent battery cells 12 are arranged adjacent to one another in such a manner that in each case a negative terminal 14 lies opposite a positive terminal 16 of the adjacent battery cell 12. A cell connector 18 is arranged between in each case two terminals 14, 16 that are arranged in this manner adjacent to one another so as to connect in each case two adjacent battery cells 12 in an electrical manner in the form of a series connection. In the embodiment illustrated in FIG. 1, the cell connectors 18 are embodied in the form of multiple bonded connections 20. By way of example, a cell connector 18 comprises six bonded connections 20.

The battery module 11 comprises a device 22 that comprises a circuit board 26. All other components of the device 22 are arranged on the circuit board 26.

The device 22 is connected by way of bonded contacts 24, 25, 25' to the terminals 14, 16 of the battery cells 12. The device 22 relating to each battery cell 12 is connected by means of a bonded contact 24 to the positive terminal 16 and by means of a bonded contact 25 to the negative terminal 14.

For the purpose of measuring the current of the battery module 11, it is sufficient to determine the magnitude of electrical current that is flowing through a cell connector 18, the reason being that the current is constant throughout the current circuit. In order to determine the current that is flowing through a cell connector 18, the voltage drop across this cell connector 18 is determined by the device 22. For this purpose, the device 22 must be connected at two sites to the cell connector 18. This is achieved in the embodied illustrated in FIG. 1 by virtue of the fact that a measurement is performed on the voltage between the positive terminal 16 of a first battery cell 12 and the negative terminal 14 of an adjacent battery cell 12. The device 22 is connected by way of example a bonded contact 24 to the positive terminal 16 of the first battery cell 12 and by means of the bonded contact 25' to the negative terminal 14 of the adjacent battery cell 12. It is possible using the known relationship I=U:R to calculate the electrical current insofar as the resistance $R_{bond}$ of the cell connector 18 is known.

The electrical resistance $R_{bond}$ of a cell connector 18 is determined in accordance with the invention with the aid of a resistance model of the cell connector 18. It is necessary to know the precise temperature of the cell connector 18 since the electrical resistance is dependent upon the temperature. In order to determine the temperature of the cell connector 18, a temperature model of the cell connector 18 is used in turn.

It is possible with the aid of the bonded contact 24 and 25 to also measure the voltage of the respective battery cell 12 by means of the device 22 so that, in addition to monitoring the current, the device 22 in further embodiments can also monitor the voltage of the battery cells 12.

Figure 2:
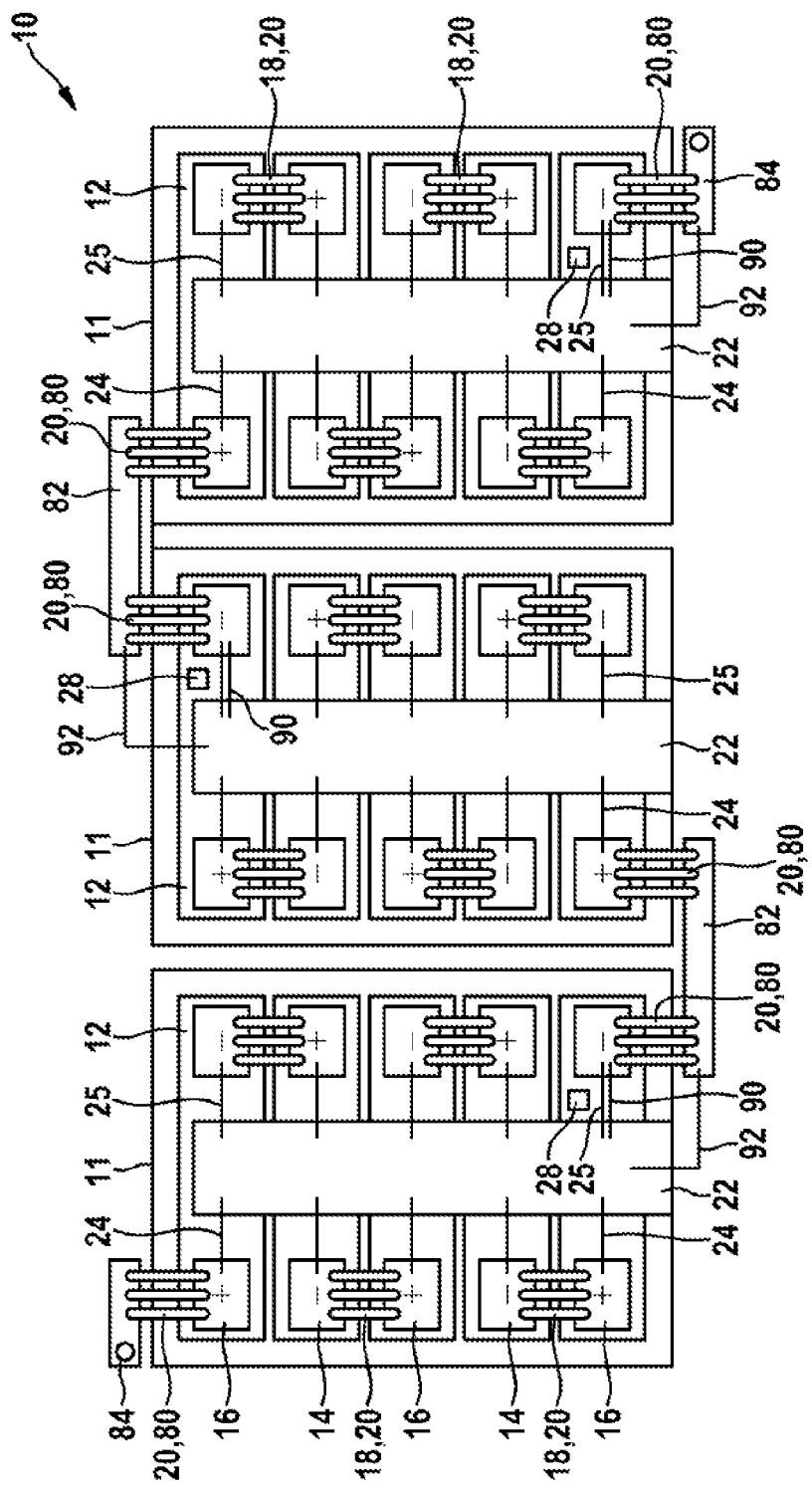
FIG. 2 illustrates a battery having multiple battery modules.

FIG. 2 illustrates a battery 10 having multiple battery modules 11.

FIG. 2 illustrates a battery 10 that comprises three battery modules 11 in the illustrated example. Each of the battery modules 11 comprises multiple battery cells 12 and also a device 22. The individual battery cells 12 of a battery module 11 are connected to one another in a series connection by means of cell connectors 18 as is described with regard to FIG. 1.

The battery modules 11 of the battery 10 are in contact with one another in an electrical manner by way of in each case two module connectors 80 and a current rail 82. Also, the battery modules 11 are connected to one another in the form of a series connection. In the illustrated embodiment, both the cell connectors 18 and also the module connectors 80 are embodied as bonded connections 20. In each case, the first and the last battery module 11 are in addition connected by way of a module connector 80 to a battery connector 84, wherein one battery connector 84 represents a positive pole of the battery 10 and the other battery connector 84 represents a negative pole of the battery 10. The battery 10 can be connected by way of the battery connectors 84 to a load or to an electrical consumer.

In the embodiment illustrated in FIG. 2, a current measurement is performed on one of the module connectors 80 for each battery module 11 of the battery 10. For this purpose, electrical connections are produced by way of a first bonded contact 90 and by way of a second bonded contact 92, by way of which it is possible to measure the voltage that is dropping at the module connector 80. In the embodiment illustrated in FIG. 2, a first bonded contact 90 makes contact with a terminal of a battery cell 12, said terminal being connected to the module connector 80. The second bonded contact 92 makes contact with a current rail 82 that is connected to the same module connector 80. It would also be feasible in lieu of the first bonded contact 90 to use a bonded contact 25 for measuring the voltage drop, said bonded contact 25 already being available for measuring the cell voltage at the terminal of the battery cell 12.

For the purpose of measuring a temperature that is allocated to a battery module 11, each battery module 11 comprises a temperature sensor 28. In the embodiment illustrated in FIG. 2, the temperature sensor 28 are arranged in each case on a terminal of a battery cell 12 that is connected to a module connector 80 by way of which the current is measured.

Figure 3:
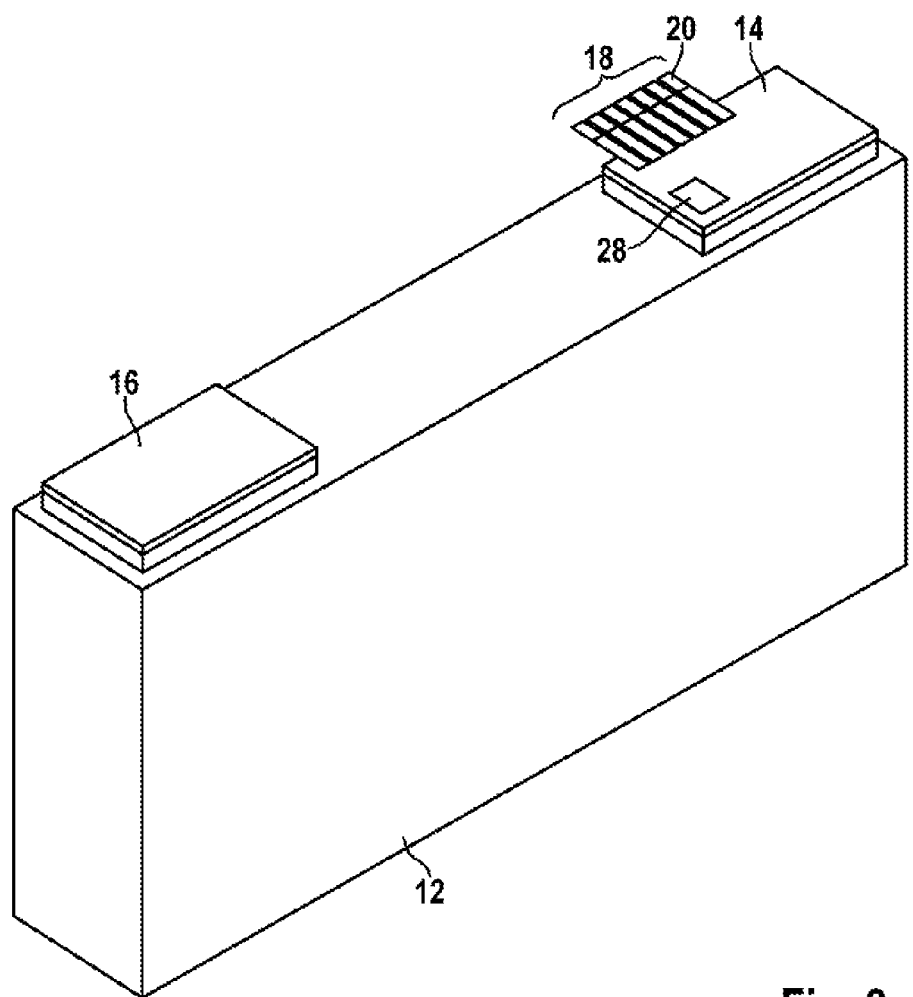
FIG. 3 illustrates a battery cell having a cell connector.

FIG. 3 illustrates a battery cell 12 having a cell connector 18.

FIG. 3 illustrates a battery cell 12. The battery cell 12 is embodied in a prismatic manner and comprises on its upper face in each case a negative terminal 14 and a positive terminal 16 by way of which the battery cell 12 is contacted in an electrical manner. A cell connector 18 is arranged at the negative terminal 14 and it is possible using said cell connector to connect the battery cell 12 to a further positive terminal 16 of an adjacent battery cell 12. In the embodiment illustrated in FIG. 2, the cell connector 18 is embodied in the form of bonded connections 20.

Furthermore, the battery cell 12 illustrated in FIG. 2 comprises a temperature sensor 28 that is arranged on the negative terminal 14. In this manner, the temperature sensor 28 has a good thermal connection both to the battery cell 12 and also to the cell connector 18. In further embodiments, it would also be feasible to arrange the temperature sensor 28 on a lateral face of the battery cell 12 or directly on the cell connector 18. Furthermore, it is feasible not to arrange a dedicated temperature sensor 28 on each battery cell 12 insofar as by way of example only one or two temperature sensors 28 are provided per battery 10 or per battery module. The temperature that is measured by the temperature sensor 28 is used together with using the temperature module so as to determine the temperature of the cell connector 18.

Figure 4:
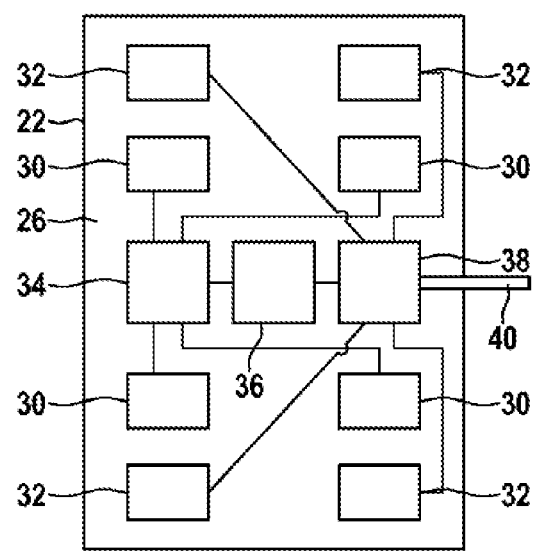
FIG. 4 illustrates a schematic view of a device for measuring the electrical current.

FIG. 4 is a schematic illustration of the construction of the device 22.

FIG. 4 is a schematic illustration of the device 22. The device 22 comprises a circuit board 26 on which further components of the device 22 can be arranged. The device 22 comprises a multiplicity of means for the temperature measuring procedure 30 and also a multiplicity of means for the voltage measuring procedure 32.

The means for the voltage measuring procedure 32 can be embodied by way of example as amplifiers having an analogue/digital converter connected downstream. In this manner, it is possible to initially amplify an electrical voltage that is being measured and then to convert this into a format that is easier to further process later.

The means for the temperature measuring procedure 30 comprise by way of example likewise an analogue/digital convertor by way of which it is possible to determine a voltage that is proportional to a temperature that is being measured. The voltage that is proportional to the temperature is by way of example provided on a temperature sensor 28, such as described with regard to FIG. 2 or 3. This temperature sensor 28 can be embodied by way of example as a thermistor, in other words as a temperature-dependent electrical resistor.

Furthermore, the device 22 comprises means for calculating the temperature 34, means for calculating the resistance 36 and means for calculating the current 38. The means for calculating the temperature, the resistance and the current, 34, 36, 38 can be embodied either as separate means or together as one unit. Furthermore, it would also be feasible to integrate the means for the voltage measuring procedure 32 and/or the means for the temperature measuring procedure 30 completely or in part. It is in particular feasible to implement the means for calculating the temperature, the resistance and the current 34, 36, 38 in the form of a computer program that is performed by way of example by a microcontroller.

The means for calculating the temperature 34 are connected to the means for the temperature measuring procedure 30. The measured temperatures are regarded as the starting point and are taken into consideration together with the temperature model for the connectors when calculating the temperature of the connectors. In further embodiments, the model also takes into consideration the current that is flowing through the connectors.

The means for calculating the resistance 36 receive the determined temperature of the cell connector 18 from the means for calculating the temperature 34 and use the determined temperature of the connectors so as to calculate their prevailing electrical resistance. As a further basis for the calculation, a calibration measurement is used, whereby in the case of a known temperature and predetermined current the resistance of the connectors is determined, and also a previously determined constant that indicates the temperature dependency of the electrical constant.

The means for calculating the current 38 receive the determined electrical resistance of the connectors from the means for calculating the resistance 36 and are connected to the means for the voltage measuring procedure 32. It is then possible using the known electrical resistance and the voltage drop that is measured at the connectors to calculate the current that is flowing by way of the connectors. Depending upon the embodiment of the invention, the measurement result can be broadcast to further control devices by way of example by way of a databus 40.

Figure 5:
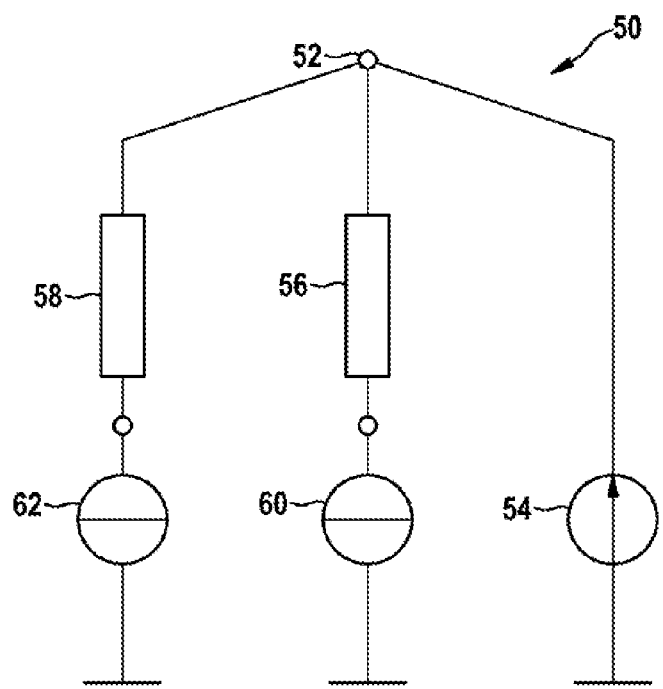
FIG. 5 illustrates a schematic view of a temperature module of a connector.

FIG. 5 illustrates a schematic illustration of a temperature module for a connector.

FIG. 5 illustrates a temperature module of a connector, by way of example a cell connector 18 or a module connector 80 in the form of a temperature network 50. The connector in the temperature network 50 is represented by a node 52. The different temperature contributions are connected to this node 52.

A Joule's heating effect 54 contributes to the temperature of the connector, in other words the connector becomes warm as a result of the electrical current that is flowing through said connector. The ambient temperature 60 makes a further contribution. In the temperature network 50, the node 52 that presents the connector is connected by way of a first thermal resistor 56 to the ambient temperature 60. The first thermal resistance 56 indicates how efficiently heat can be exchanged between the ambient temperature 60 and the node 52.

A further contribution is made by the connection of the connector to the terminals 14, 16 of a battery cell 12 that is represented by a terminal 62 in FIG. 5. A second thermal resistor 58 is arranged between the temperature of the terminal 62 and the node 52 and said second thermal resistor indicates how efficiently heat is transferred from the terminal 62 to the connector.

In the case of the temperature model, the Joule's heating effect 54 is taken into consideration by way of the expression:

$$P_{bond} \cdot Rth_{ct} \cdot Rth_{amb} : (Rth_{amb} + Rth_{ct})$$

The exchange of heat with the environment and also the heat transfer between the connector and the terminals 62 are taken into consideration in the temperature model by way of the expressions:

$$T_{amb} \cdot (Rth_{ct} : (Rth_{ct} + Rth_{amb})) \text{ or}$$

$$T_{ct} \cdot (Rth_{amb} : (Rth_{amb} + Rth_{ct})).$$

FIG. 6 illustrates the measurement of a current and also the error in the case of the current measurement with and without temperature compensation.

FIG. 6 illustrates the progression of the current 70 plotted over time. The current strength is indicated on the left-hand Y-axis. Furthermore, FIG. 6 illustrates the error in the case of the current measurement with temperature compensation in the graph 72 and in the graph 74 without temperature compensation. The variable dI indicates how many amperes the current measurement deviates from the actual current. The right-hand Y-axis indicates the error in the current measurement.

As is easily evident from the illustration in FIG. 6, the measurement error in the case of the current measurement without taking into consideration the temperature, as illustrated in the graph 74, represents a multiple greater than the error in the case of the current measurement when taking into consideration the temperature of the cell connector 18, as illustrated in the graph 72. It is evident particularly in the time region between 30 seconds and 50 seconds that the measurement error in the graph 74 without taking into consideration the temperature of the cell connector 18 increases considerably. This is as a result of the fact that a greater current of −82 A flows in this time period. Since the algebraic sign is negative, the current in this case is a charging current. While the battery 10 is being charged with this constant charging current, the cell connectors 18 in the battery 10 become increasingly warmer, as a result of which their electrical resistance becomes increasingly greater. If this temperature change is not taken into consideration, such as is proposed in accordance with the invention by means of taking into consideration a temperature module, the measuring error consequently continues to increase.

The invention is not limited to the exemplary embodiments described herein and the aspects that are emphasized therein. On the contrary, a multiplicity of modifications that lie within the scope of skilled endeavors are possible within the range disclosed by the claims.

The invention claimed is:

1. A method for measuring an electrical current of a battery (10) having at least two battery modules (11) having in each case at least two battery cells (12), said method comprising for at least one battery module (11) the step of measuring a temperature that is allocated to the battery module (11) and for at least one connector of the battery module (11) the steps of:
   a) determining the temperature of the connector with the aid of the measured temperature and a temperature model,
   b) calculating the electrical resistance of the connector with the aid of a resistance model and the temperature of the connector that is determined in accordance with step a),
   c) measuring the electrical voltage that drops at the connector, and
   d) calculating the electrical current that is flowing through the connector, said calculation being based on the calculated electrical resistance in accordance with step b) and the voltage measured in step c),
      wherein the connector is a cell connector (18) that connects two battery cells (12) of the battery module (11) to one another in an electrical manner, or said connector is a module connector (80) that contacts the battery module (11) in an electrical manner.

2. The method as claimed in claim 1, characterized in that the temperature that is allocated to the battery module (11) is measured and that the steps a) to d) are performed for each battery module (11) of the battery (10).

3. The method as claimed in claim 1, characterized in that a mean value is formed for the electrical current of the battery (10) from the electrical currents that are calculated for the connectors of the battery (10).

4. The method as claimed in claim 3, characterized in that the temperatures that are determined for the battery modules (11), the electrical voltages that are measured in accordance with step c) or both are compared with the respective mean values and in the case of the measurements of a battery module (11) deviating from the mean value of the measurements to such an extent that a threshold value is exceeded, it is concluded that the measuring means (30, 32) have failed.

5. The method as claimed in claim 4, characterized in that in the event of a failure of the measuring means (30, 32) only those connectors for which a current can be determined are taken into consideration when calculating the mean value.

6. The method as claimed in claim 1, characterized in that the resistance models of the connectors (18) are calibrated, in that the battery (10) is charged with a defined charging current and the electrical resistance of the connectors is determined simultaneously.

7. The method as claimed in claim 6, characterized in that the calibration results of the resistance models of the connectors are compared with one another and if a calibration result of a connector deviates from a mean value of the calibration results to such an extent that a threshold value is exceeded, then it is concluded that an error has occurred during the calibration process.

8. A device (22) for measuring the electrical current of a battery (10) having multiple battery modules (11) having in each case multiple battery cells (12), the device comprising:
   for at least one of the battery modules (11), means for temperature measuring to determine a temperature that is allocated to the battery module (11),
   means for voltage measuring to determine a voltage drop at a connector,
   means for calculating a temperature (34) of the connector by taking into consideration the measured temperature and a temperature model,
   means for calculating the electrical resistance (36) of the connector by taking into consideration the calculated temperature of the connector and a resistance model,
   means for calculating the electrical current (38) that is flowing through the connector,
   wherein the connector is a cell connector (18) that connects two battery cells (12) of the battery module (11) to one another in a bonded electrical manner, or said connector is a module connector (80) that contacts the battery module (11) in a bonded electrical manner.

9. The device (22) as claimed in claim 8, characterized in that the connectors are embodied as bonded connections (20).

10. The device (22) as claimed in claim 8, characterized in that the material for the connector is selected from an aluminum alloy, copper, Manganin, Constantan.

11. The device (22) as claimed in claim 8, characterized in that the device (22) comprises a circuit board (26) on which the means for the voltage measuring procedure (32) are arranged.

12. The device (22) as claimed in claim 11, characterized in that the circuit board (26) is connected to the connectors by way of bonded contacts (24, 25, 25', 90) so that it is possible to measure the voltage drop at a connector.

13. The device (22) as claimed in claim 8, characterized in that the means for the temperature measuring procedure (30) comprise a temperature sensor (28) that are arranged on a terminal (14, 16) of a battery cell (12).

14. A battery (10) comprising a device (22) in accordance with claim 8.

15. The battery (10) as claimed in claim 14, characterized in that each battery module (11) of the battery (10) comprises two module connectors (80), wherein one module connector (80) is connected in an electrical bonded manner to a current rail (82) and the other module connector (80) is connected in an electrical bonded manner to another current rail (82) or to a battery connector (84).

16. The method as claimed in claim 1, wherein measuring the electrical voltage that drops at the connector includes comparing a voltage from a first bonded contact (90) provided on a terminal of a battery cell (12) and a voltage from a second bonded contact (92) provided in contact with a current rail (82) that is connected to the same module connector (80).

17. The method as claimed in claim 16, wherein the cell connector (18) that connects two battery cells (12) of the battery module (11) to one another in an electrical manner is embodied as multiple bonded connections.

18. The method as claimed in claim 17, wherein the cell connector (18) having the multiple bonded connections includes six of the bonded connections.

19. The method as claimed in claim 1, wherein the temperature model determines the temperature of the connector with the aid of the measured temperature by calculating $$T_{bond} = (T_{amb} \times Rth_{ctb} + T_{ct} \times Rth_{amb} + P_{bond} \times Rth_{ctb} \times Rth_{amb})/(Rth_{amb} + Rth_{ctb}),$$

wherein $T_{bond}$ represents the temperature of the connector,
wherein $T_{amb}$ represents the ambient temperature,
wherein $T_{ct}$ represents the temperature at a terminal of a battery cell,
wherein $Rth_{ctb}$ represents the thermal resistance between the cell terminal and the connector,
wherein $Rth_{amb}$ represents the thermal resistance between the connector and the environment, and
wherein $P_{bond}$ represents the power lost at the connector as a result of the Joule's heating effect.

20. The method as claimed in claim 19, wherein the resistance model calculates the resistance of the connector with the previously determined temperature $T_{bond}$ by calculating $$R_{bond}(T_{bond}) = R_{bond}(T0) + R_{bond}(T0) \times A \times (T_{bond} - T0),$$

wherein $R_{bond}$ represents the electrical resistance of the connector,
wherein $R_{bond}(T0)$ represents the electrical resistance of the cell at temperature T0, and
wherein A is a contact that indicates the temperature dependence of the resistance of the connector.

* * * * *